United States Patent [19]
Stoichita et al.

[11] Patent Number: 5,901,350
[45] Date of Patent: May 4, 1999

[54] LOW DISTORTION LARGE SWING FREQUENCY DOWN COVERTER FILTER AMPLIFIER CIRCUIT

[75] Inventors: Ioan Stoichita, San Jose; Ignatius S. A. Bezzam, Mountain View, both of Calif.

[73] Assignee: Fairchild Semiconductor Corporation, South Portland, Me.

[21] Appl. No.: 08/727,818

[22] Filed: Sep. 30, 1996

[51] Int. Cl.⁶ ...................................................... H04B 1/28
[52] U.S. Cl. ........................ 455/333; 455/326; 327/113; 327/359
[58] Field of Search ..................................... 455/335, 326, 455/313, 317, 323, 337, 325, 314, 207, 209; 327/113, 359, 358, 120, 121

[56] References Cited

U.S. PATENT DOCUMENTS

| | | | |
|---|---|---|---|
| 5,214,390 | 5/1993 | Montreuil | 329/309 |
| 5,287,351 | 2/1994 | Wall | 370/206 |
| 5,465,415 | 11/1995 | Bien | 455/326 |
| 5,477,191 | 12/1995 | Demicheli | 330/254 |
| 5,493,713 | 2/1996 | Horsfall et al. | 455/236.1 |
| 5,507,036 | 4/1996 | Vagher | 455/295 |
| 5,532,637 | 7/1996 | Khoury | 327/455 |
| 5,630,228 | 5/1997 | Mittel | 455/326 |

FOREIGN PATENT DOCUMENTS

| | | |
|---|---|---|
| 0 414 305 A2 | 2/1991 | European Pat. Off. . |
| 0 498 221 | 8/1992 | European Pat. Off. . |
| 0 565 299 A1 | 10/1993 | European Pat. Off. . |
| 2 260 870 | 4/1993 | United Kingdom . |

OTHER PUBLICATIONS

IEEE, 1993 (A High–Gain HEMT Monolithlic Down coverter for X–Band Direct Broadcast Satellite Applications) p. 229, Joslin et al, Mar. 1993.

*Primary Examiner*—Wellington Chin
*Assistant Examiner*—Lee Nguyen
*Attorney, Agent, or Firm*—Skjerven, Morrill, MacPherson, Franklin & Friel LLP; Norman R. Klivans; Gary J. Edwards

[57] ABSTRACT

A semiconductor integrated circuit to provide a low distortion, large swing intermediate frequency wherein the circuit includes the function of mixing, filtering, and amplification on a single chip. A pair of differential currents are obtained from the mixer, the differential currents are filtered and conditioned, converted to a pair of differential voltages and amplified to obtain the low distortion, large swing intermediate frequency.

12 Claims, 2 Drawing Sheets

LOW DISTORTION LARGE SWING FREQUENCY DOWN COVERTER FILTER AMPLIFIER CIRCUIT

BACKGROUND OF THE INVENTION

1. Field of the Invention

This invention relates generally to high frequency demodulating circuits used in communications applications and, more particularly, to a high frequency demodulating circuit in which the necessary signal processing functions of mixing, filtering, and amplification are combined to minimize cost.

2. Discussion of the Related Art

Frequency down-conversion mixers are generally implemented using a prior art circuit called a "Gilbert cell" shown in FIG. 1. The Gilbert cell is a fully differential architecture whose input is a set of differential voltages $V_{LO\pm}$ and $V_{RF\pm}$ that generates a differential voltage output $V_{IF\pm}$. The voltage output may be tuned or filtered to remove unwanted by-products generated by the mixing process. In a demodulator the wanted output is generally referred to as the baseband output. Its frequency is the difference of the frequencies at the LO (local oscillator) and RF (radio frequency) inputs.

One of the limitations of the basic Gilbert cell is that it is difficult to achieve a large voltage swing for a given supply voltage. Since the wanted and unwanted components are present in equal measure the available swing range is wasted. The same criterion also limits the voltage gain available in the mixing process. Larger voltage gain implies larger voltage swing at the outputs. If the voltage swing is limited the practical voltage gain is also limited. Another condition limiting the voltage gain comes from the DC biasing considerations. The gain is set by the ratio of resistors $R_L/R_{IN}$. In order to achieve a specific distortion performance level, the resistor $R_{IN}$ is chosen to be a minimum value for a given bias current $I_B$. Choosing large gain values implies a large value for the resistor $R_L$. For practical operation, the DC values at the $V_{IF\pm}$ nodes cannot be lower than the DC values at the $V_{LO\pm}$ nodes.

The above limitations are generally overcome by keeping the gain low in the mixers and using filters situated externally to the integrated circuit for removing the unwanted high frequency components. This means that the signals must first be routed out of the integrated circuit, filtered, then routed back to the integrated circuit for further amplification. This solution requires more pins for taking the signals out of the integrated circuit and back into the integrated circuit. The requirement to take the signals out and back in to the integrated circuit degrades the signals. In addition, it is difficult to maintain the balanced differential nature of the signals once they are taken out of the integrated circuit and then reinserted into the integrated circuit. If the differential nature of the signals is not fully maintained the succeeding amplifiers will amplify not only the desired baseband signal but will amplify the extra distortion introduced externally as well.

What is needed is a differential amplifier circuit that maintains the fully differential nature of the signals, minimizes distortion, and provides the required high gain.

SUMMARY OF THE INVENTION

The invention is directed to a semiconductor integrated circuit which provides a low distortion, large swing intermediate frequency. The functions of mixing, filtering, and amplification are provided on one chip.

The invention is directed to a circuit which provides a pair of differential currents which are filtered and conditioned and then converted to a pair of differential voltages which are amplified.

The pair of differential currents are filtered by a low pass filter.

The pair of differential currents are conditioned by a pair of current mirrors and a bias circuit.

The pair of differential currents are converted to a pair of differential voltages and amplified by a circuit utilizing negative feedback.

The present invention is directed to a method of obtaining a low distortion, large swing intermediate frequency from a circuit on a single semiconductor integrated chip by obtaining a pair of differential currents, converting the pair of differential currents to a pair of differential voltages and amplifying the pair of differential voltages.

The pair of differential currents are conditioned by a filter, a pair of current mirrors, and a bias circuit.

The pair of differential currents are converted to a pair of differential voltages and amplified by a circuit which includes a differential amplifier and a pair of amplifiers utilizing negative feedback.

The present invention provides a fully differential-mixer-filter-amplifier circuit. The circuit avoids the voltage swing limitations of the prior art Gilbert cell by transferring signals as currents from the mixer instead of voltages. In addition, this transfer of signals as currents instead of voltages overcomes the limitation of DC biasing. Since the unwanted components are usually much higher in frequency, a resistance and capacitance are used to remove these components from the current signal transferred. Since no voltage gain is desired in the first stage the value of the resistor can be small which avoids the DC bias problems. The currents are converted into voltages through the use of a feedback structure that maintains high frequency response while delivering an overall voltage gain. This is facilitated because the voltages swing only at the final output node.

The present invention is better understood upon consideration of the detailed description below, in conjunction with the accompanying drawings. As will become readily apparent to those skilled in this art from the following description there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The accompanying drawings incorporated in and forming a part of the specification, illustrate the present invention, and together with the detailed description below serve to explain the principles of the invention. In the drawings.

DETAILED DESCRIPTION

Figure 1:
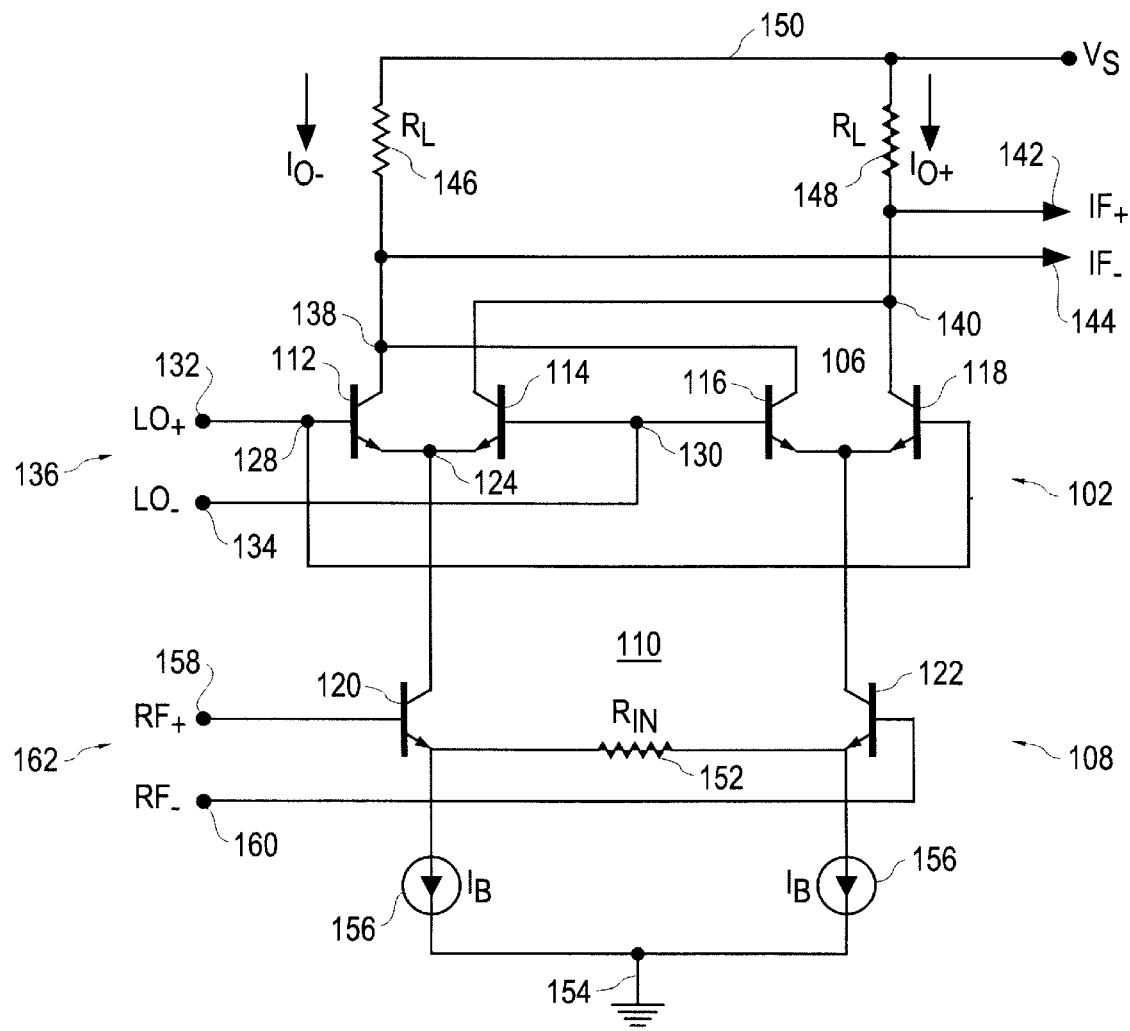
FIG. 1 shows a prior art frequency down-conversion circuit including a "Gilbert cell" four quadrant multiplier circuit.

In the following description, for purposes of clarity and conciseness of the description, not all of the numerous components shown in the schematics are described or described in detail. The numerous components are shown in the drawings to provide a person of ordinary skill in the art a thorough enabling disclosure of the present invention. It will be apparent to one skilled in the art that a detailed description of all of the specific components is not required in order for one of ordinary skill in the art to practice the present invention. Therefore, only those components that are affected by the present invention or that are necessary for an understanding of the operation of the present invention will be discussed in detail.

Referring to FIG. 1, a prior art circuit 100, known generally as a "Gilbert cell" multiplier is shown and is well known in the communications art. The circuit 100 includes a transistor tree circuit including an upper circuit 102 which includes a pair of differential amplifiers 104 and 106 and a lower circuit 108 which includes another differential amplifier 110.

Each of the differential amplifiers 104, 106, and 110 include first and second NPN transistors, 112 and 114, 116 and 118, and 120 and 122, respectively. The emitter electrodes of the transistors 112 and 114 are connected together forming the common junction 124 and the emitter electrodes of the transistors 116 and 118 are connected together forming the common junction 126. The common junctions 124 and 126 are connected to the collector electrodes of the transistors 120 and 122, respectively. The base electrodes of the transistors 112 and 118 are interconnected at the junction 128. The base electrodes of the transistors 114 and 116 are interconnected at the junction 130. The input terminals 132 and 134 of the upper input port 136 are connected to the common junctions 128 and 130, respectively.

The collector electrodes of the transistors 112 and 116 are interconnected at the common junction 138. The collector electrodes of the transistors 114 and 118 are interconnected at the common junction 140. The output terminals 142 and 144 together with one terminal of the load resistors 146 and 148 are connected to the common junctions 138 and 140, respectively. The other terminals of the load resistors 146 and 148 are connected to the positive supply line 150.

The emitter electrodes of the transistors 120 and 122 are connected to each other via the resistor $R_{IN}$ 152 and to the ground line 154 via the constant current sources, indicated at 156. The input terminals 158 and 160 of the lower input port 162 are connected, respectively, to the base electrodes of the transistors 120 and 122.

The Gilbert cell circuit shown in FIG. 1 is sometimes known as a four quadrant multiplier circuit. The Gilbert cell is a fully differential architecture whose input is a set of the differential voltages LO± at the port 136 and the differential voltages RF± at the port 162 that generates a differential voltage output, IF±, at the output terminals 142 and 144. The voltage output may be tuned or filtered to remove unwanted by-products generated by the mixing process. In a demodulator, the wanted output frequency is generally referred to as the baseband frequency, which is the difference of the frequencies of the signals at the LO± and the RF± inputs.

Figure 2:
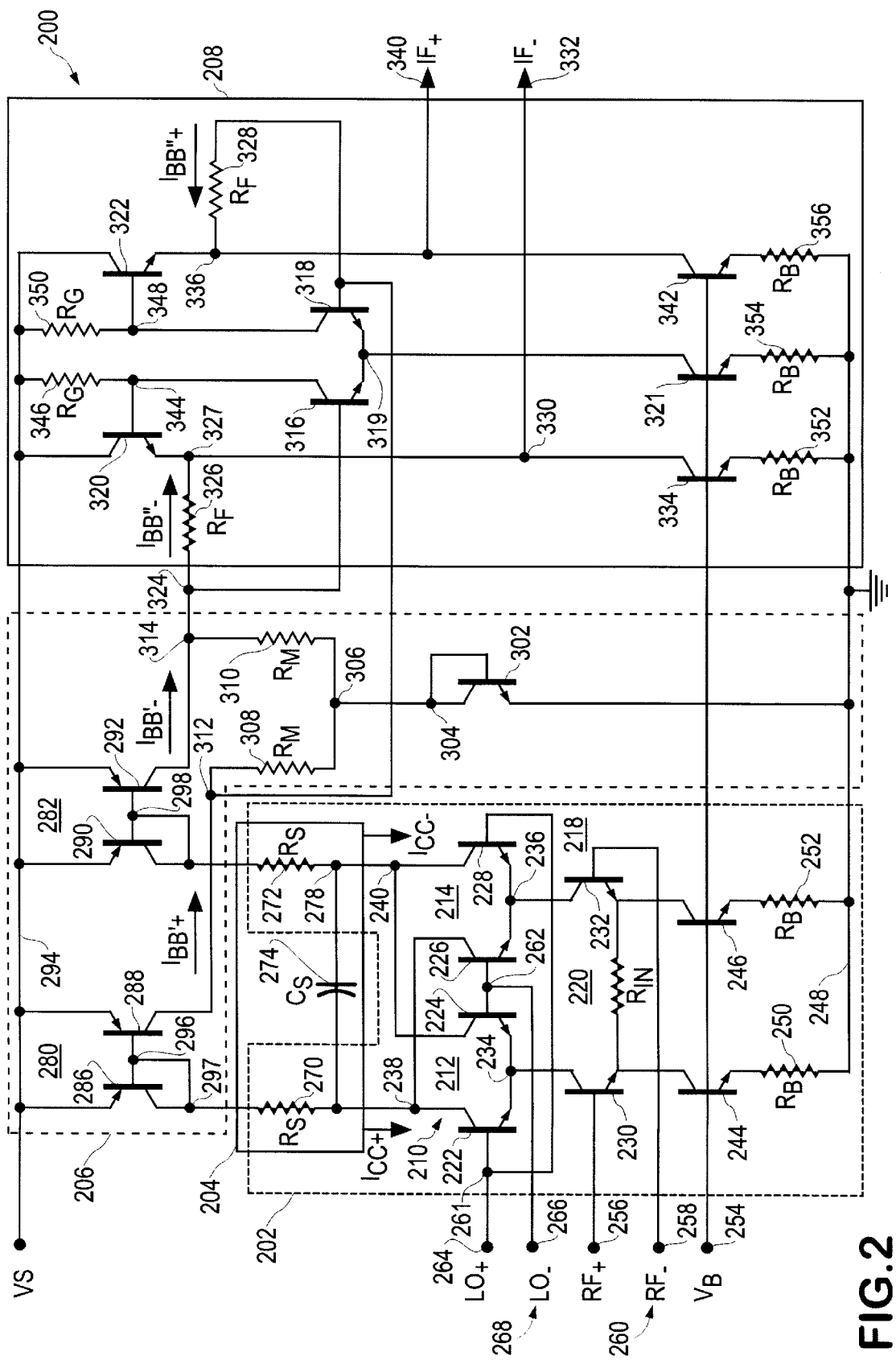
FIG. 2 shows a schematic diagram of an embodiment of the present invention which operates as an integrated mixer, filter, and amplifier.

Referring to FIG. 2 there is shown an embodiment of the present invention. The circuit 200 operates as an integrated mixer (multiplier), filter, and amplifier. The operation of the combined circuit may be better understood if the circuit is divided into four sections and each section explained separately. Each section will first be discussed in general terms with a subsequent detailed description.

The first section, within the dashed lines 202, is similar to the prior art Gilbert four quadrant multiplier cell shown in FIG. 1. The sum and difference frequencies are coupled out of the first section, indicated by the dashed lines 202, as current signals rather than as voltage signals as shown in FIG. 1. The second section, within the dashed lines 204, is a filter section which substantially limits the unwanted high frequency signals from being coupled out of the first section and subsequently amplified. The currents generated in the first section, indicated by the dashed lines 202, are coupled to the second section, indicated by the dashed lines 204, which includes two resistors and a capacitor. The third section, within the dashed lines 206, includes current transfer circuitry that couples the filtered baseband signal currents to a shunt-shunt feedback structure that produces overall voltage amplification. In the fourth section, within the dashed lines 208, the baseband currents flow through feedback resistors to generate the required voltage swing. The voltage swing therefore only occurs at the IF± outputs.

Referring now to the circuit in the first section, indicated by the dashed lines 202, the circuit generally includes a circuit known as a transistor tree circuit and includes the upper circuit 210 which includes the pair of differential amplifiers 212 and 214 and the lower circuit 218 which includes the differential amplifier 220. Each of the differential amplifiers 212, 214, and 220 include first and second NPN transistors; 222 and 224, 226 and 228, and 230 and 232, respectively. The emitter electrodes of the transistors 222 and 224 are connected together and form the common junction 234. The emitter electrodes of the transistors 226 and 228 are connected together and form the common junction 236. The common junction 234 is connected to the collector electrode of the transistor 230 and the common junction 236 is connected to the collector electrode of the transistor 232. The collector electrodes of the transistors 222 and 226 are interconnected and form the common junction 238. The collector electrodes of the transistors 224 and 228 are interconnected and form the common junction 240.

The emitter electrodes of the transistors 230 and 232 are connected via the resistor $R_{IN}$ 242 and to the collector electrodes of the NPN transistors 244 and 246, respectively. The emitter electrodes of the transistors 244 and 246 are connected to the common ground line 248 via the bias resistors $R_B$ 250 and 252, respectively. The base electrodes of the transistors 244 and 246 are connected to the source of voltage $V_B$ 254. The base electrodes of the transistors 230 and 232 are connected to the input terminals 256 and 258 of the lower input port 260.

The base electrodes of the transistors 222 and 228 are interconnected and form the common junction 261. The base electrodes of the transistors 224 and 226 are interconnected and form the common junction 262. The common junctions 261 and 262 are connected to the input terminals 264 and 266, respectively. The input terminals 264 and 266 form the upper input port 268.

Referring now to the circuit in the second section, indicated by dashed lines 204, the circuit is a filter circuit and includes the two resistors $R_S$, 270 and 272, and the capacitor $C_S$ 274. One electrode of the resistor 270 is connected to an electrode of the capacitor $C_S$ 274 and to the common junction 238 making one connection to the circuit in the first section, indicted by the dashed lines 202. One electrode of the resistor 272 is connected to the other electrode of the capacitor $C_S$ 274 and to the common junction 240 making a second connection to the circuit in the first section, indicated by the dashed lines 202.

The common junction 276 is defined by the interconnection of an electrode of the resistor $R_S$ 270, an electrode of the capacitor $C_S$ 274, and a connection to the common junction 238. The common junction 278 is defined by the interconnection of an electrode of the resistor $R_S$ 272, an electrode of the capacitor $C_S$ 274, and a connection to the common junction 240.

Referring now to the circuit in the third section indicated by dashed lines 206, the circuit generally includes current transfer circuitry including the first current mirror 280, the second current mirror 282, and the bias level setting circuit 284 to set the bias level of the current mirrors 280 and 282. The first current mirror 280 includes two PNP transistors 286 and 288 and the second current mirror 282 includes two PNP transistors 290 and 292. The emitter electrodes of the transistors 286, 288, 290, and 292 are connected to the positive voltage supply line 294. The base electrodes of the transistors 286 and 288 are interconnected and form the common junction 296. The common junction 296 is connected to the collector electrode of transistor 286 at the common junction 297. The base electrodes of the transistors 290 and 292 are interconnected and form the common junction 298. The common junction 298 is connected to the collector electrode of transistor 290 at the common junction 300.

The bias level setting circuit 284 includes NPN transistor 302 with its base electrode connected to its collector electrode forming the common junction 304 which is connected to the common junction 306 which is formed by the interconnection of an electrode of the resistor $R_M$ 308 and an electrode of the resistor $R_M$ 310. The emitter electrode of the transistor 302 is connected to the common ground line 248. The other electrode of the resistor $R_M$ 308 is connected to the collector electrode of the transistor 288 forming the common junction at 312. The other electrode of the resistor $R_M$ 310 is connected to the collector electrode of the transistor 292 forming common junction at 314.

The common junction 297 is connected to an electrode of the resistor $R_S$ 270 making a first connection with the circuit in the second section 204. The common junction 300 is connected to an electrode of the resistor $R_S$ 272 making a second connection with the circuit in the second section 204.

Referring now to the circuit in the fourth section indicated by dashed lines 208, the circuit generally includes the current to voltage amplifier 314. The current to voltage amplifier 314 is a shunt-shunt feedback structure that produces overall voltage amplification. The current to voltage amplifier 314 includes the NPN transistors 316 and 318 and the NPN transistors 320 and 322. The emitter electrodes of the NPN transistors 316 and 318 are interconnected forming the common junction 319. The common junction 319 is connected to the collector electrode of the NPN transistor 321. The base electrode of the transistor 316 is connected to the common junction 324 which is connected to the common junction 314 making a first connection to the circuit in the third section indicated by the dashed lines 206. The base electrode of the transistor 316 is also connected to an electrode of the resistor $R_F$ 326. The other electrode of the resistor $R_F$ 326 is connected to the emitter electrode of the transistor 320 forming the common junction 327. The collector electrode of the transistor 320 is connected to the supply voltage $V_S$ line 294. The common junction 327 is connected to the common junction 330 which is connected to the output terminal IF_ 332 and to the collector electrode of the NPN transistor 334. The base electrode of the transistor 318 is connected to the common junction 312 making a second connection to the circuit in the third section, indicated by the dashed lines 206. The base electrode of the transistor 318 is also connected to an electrode of the resistor $R_F$ 328. The other electrode of the resistor $R_F$ 328 is connected to the emitter electrode of the transistor 322 forming the common junction 336. The collector electrode of the transistor 322 is connected to the supply voltage, $V_S$, line 329. The common junction 336 is connected to the common junction 338 which is connected to the output terminal IF_+ 340 and to the collector electrode of the NPN transistor 342.

The base electrode of the transistor 320 is connected to the collector electrode of the transistor 316 forming the common junction 344. The common junction 344 is connected to an electrode of the resistor $R_G$ 346. The other electrode of the resistor $R_G$ 346 is connected to the supply voltage $V_S$ line 294. The base electrode of the transistor 322 is connected to the collector electrode of the transistor 318 forming the common junction 348. The common junction 348 is connected to an electrode of the resistor $R_G$ 350. The other electrode of the resistor $R_G$ 350 is connected to the supply voltage $V_S$ line 294.

The emitter electrode of the transistor 334 is connected to the ground line 248 via the resistor $R_G$ 352. The emitter electrode of the transistor 321 is connected to the ground line 248 via the resistor $R_G$ 354. The emitter electrode of the transistor 342 is connected to the ground line 248 via the resistor $R_G$ 356. The base electrodes of each of NPN transistors 334, 321, and 342 are connected to the source of voltage $V_B$ 254.

The operation of the circuit is as follows. Referring to FIG. 1 the operation of the circuit, known as a Gilbert multiplier cell, is well known in the art. A key operation in communications systems is a process known as mixing, which is the deliberate combination of two input signals of different frequencies in a time-varying or nonlinear device to produce an output signal that contains new frequencies. An analog multiplier, such as the Gilbert multiplier cell, mixes by producing an output that is the instantaneous product of signals applied to its two inputs (thus the term "multiplier"). Gilbert multiplier cells are commonly used in communications receivers as demodulators which separate useful information from carrier signals. The Gilbert multiplier cell is also known as a four-quadrant multiplier whose output is the product of its two inputs regardless of their algebraic signs. In FIG. 1 there is a first signal input at the port 136 from a local oscillator (not shown). The input signal at the LO port 136 from the local oscillator is indicated as the $LO_+$ signal input at the input terminal 132 and the $LO_-$ signal input at the input terminal 134. The input signal at the RF port 162 is indicated as the $RF_+$ signal input at the input terminal 158 and the $RF_-$ signal input at the input terminal 160 and is input from an external source (not shown). The external source could be from a cable (such as a cable TV system) or an antenna which receives a broadcast signal (which could also be a TV system) on a carrier which is typically a higher frequency than the frequency of the local oscillator. As is known in the communications art, the circuit in FIG. 1 will demodulate (mix) the two sets of signals to output a set of intermediate frequency signals, the $IF_+$ signal at the output terminal 142 and the $IF_-$ signal at the output terminal 144. The relationships between the signals are as follows:

$$V_{IF+} - V_{IF-} = K^* (V_{RF+} - V_{RF-})^*(V_{LO+} - V_{LO-}),$$

where $V_{IF+}$ represents the voltage of the $IF_+$ signal, $V_{IF-}$ represents the voltage of the $IF_-$ signal, etc. and $V_{RF+}$ and $V_{RF-}$ represent the voltages of the signals which are out of phase by 180 degrees; and the intermediate frequency $f_{IF}$ includes the frequency which is the sum of the input frequencies, ($f_{RF}$+$f_{LO}$), and the frequency which is the difference of the input frequencies, ($f_{RF}$-$f_{LO}$), The desired baseband frequency is the difference frequency ($f_{RF}$-$f_{LO}$).

From the above relationships, it is observed that the frequency $f_{IF}$ is a function of the sum of the two input frequencies, ($f_{RF}$+$f_{LO}$) and the difference between the two input frequencies ($f_{RF}$-$f_{LO}$). The desired baseband frequency is the difference between the two frequencies. This indicates that there is a necessity to remove from the overall signal any component of the signal other than the difference frequency of the two input frequencies. In addition, because the output signal at the output terminals 142 and 144 is a differential voltage signal, there is an inability to achieve a large voltage swing for a given supply voltage in the basic Gilbert cell.

Referring to FIG. 2 an embodiment of the present invention is shown and the physical structure has been described above in detail. The portion of the circuit within the dashed lines 202 is basically a mixer analogous to the Gilbert multiplier cell shown in FIG. 1. Similar to the operation of the circuit shown in FIG. 1, the circuit within the dashed lines 204 has a first signal input at the port 268 from a local oscillator (not shown). The signal input at the port 268 from the local oscillator is indicated as the $LO_+$ signal input at the input terminal 264 and the $LO_-$ signal input at the input terminal 266. There is a second RF signal input at the port 260 from an external source (not shown). As discussed above, the external source could be from a tuner output from a cable TV or satellite feed. The signal input at the port 260 from the external signal source is indicated as the $RF_+$ signal input at the input terminal 256 and the $RF_-$ signal input at the input terminal 258. The circuit within the dashed lines 202 will demodulate (mix) the two sets of signals. However, unlike the circuit shown in FIG. 1, a set of output voltages is not taken from the collector electrodes of the pertinent transistors making up the differential amplifiers 212 and 214. Instead, a set of differential currents, $I_{BB+}$ flowing into the common junction 276 and $I_{BB-}$ flowing into the common junction 278 are coupled to the remainder of the circuit 200. The relationships between the ac signals are as follows:

$I_{CC+}$=-$I_{CC-}$, and $I_{CC+}$=$I_{BB}$sin 2π($f_{RF}$-$f_{LO}$)t+$i_{BR}$(t), where $i_{BR}$(t) is the parasitic residue spectrum of frequencies from the mixing process and includes an important power component having the frequency sum ($f_{RF}$+$f_{LO}$).

The currents $I_{CC+}$ and $I_{CC-}$ flowing into the common junctions 276 and 278 are within the filter circuit defined by the dashed lines 204 which includes the matched resistors $R_S$ 270 and 272 and the capacitor $C_S$ 274. The filter circuit is designed as a low pass filter which will substantially filter out the high frequency sum ($f_{RF}$+$f_{LO}$) leaving only the frequency difference, which is the desired baseband signal, in the currents $I_{CC+}$ and $I_{CC-}$. The sizes of the matched resistors $R_S$ 297 and 300 and the capacitor $C_S$ 274 are selected depending upon the frequencies $f_{RF}$ and $f_{LO}$. The method of selection of the values of the resistors $R_S$ and the capacitor $C_S$ is well known in the art and will not be discussed herein.

The currents $I_{BB+}$ and $I_{BB-}$ flow from the common junctions 297 and 300, respectively, which are within the circuit indicated by the dashed line 206. The circuit within the dashed lines 206 functions as a current conditioning circuit and conditions the currents $I_{BB+}$ and $I_{BB-}$. The current mirror 280 mirrors the current $I_{BB+}$ from the common junction 297 and causes the mirror current, indicated by $I_{BB'+}$, to flow in the collector electrode of the transistor 288 to the common junction 312. Theoretically, a current mirror such as 280 mirrors a current "exactly." However, practically a current mirror, because of manufacturing parameters, etc., does not "exactly" mirror the current. Therefore, the current $I_{BB'+}$ is denoted with a prime indicating that it may differ from the current $I_{BB+}$. It is to be understood that it is intended for the current from the collector of transistor 288 to mirror that at the common junction 297. Similarly, the current mirror 282 mirrors the current $I_{BB-}$ from the common junction 300 and causes the mirror current, indicated by $I_{BB'-}$, to flow in the collector electrode of the transistor 292 to the common junction 314. The circuit, indicated at 284, sets the bias of transistors 288 and 292. The circuit 284 includes the two matched transistors $R_M$ 308 and 306 and the NPN transistor 302 acting as a diode, thus having a voltage drop of approximately 0.7 volts.

The circuit within the dashed lines 208 is a current-to-voltage amplifier and converts the currents $I_{BB'+}$ and $I_{BB'-}$ to voltages, amplifies them, and outputs them at the output terminals 340 and 332. The circuit within the dashed lines 208 has negative feedback with the matched resistors $R_F$ 326 and 328 serving as feedback resistors to the transistors 320 and 322. It is noted that the currents within the dashed line 208 are denoted as $I_{BB''+}$ and $I_{BB''-}$. It is the intention that the currents denoted as $I_{BB''+}$ and $I_{BB''-}$ be equal to the currents denoted as $I_{BB'+}$ and $I_{BB'-}$, however, the currents may, in practice, be different because of manufacturing differences. Therefore, the different designations are to indicate that the currents may be slightly different. The transistors 334, 321, and 342 together with the matched resistors $R_B$ 352, 354, and 356 provide the proper bias for the transistors 320, 316, 318, and 322. The output signals $IF_+$ and $IF_-$ of the circuit 200 appear at the output terminals 340 and 332, respectively.

The foregoing description of the preferred embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What we claim is:

1. A circuit to provide a low distortion, large swing intermediate frequency, the circuit comprising:

a first portion of the circuit which outputs first and second currents each of which include a first frequency component equal to a sum of the frequencies of two sets of signals input to the first portion of the circuit and a second frequency component equal to a difference of the frequencies of the two sets of signals input to the first portion of the circuit;

a second portion of the circuit that receives the first and second currents from the first portion of the circuit and filters one of the first or second frequency components out of the first and second currents; and a third portion of the circuit which amplifies a remaining frequency component of the first and second currents the remaining frequency component being the first or second frequency component of the first and second currents that was not filtered by the second portion of the circuit.

2. The circuit of claim 1, further comprising a fourth portion of the circuit which conditions the first and second currents.

3. A circuit to provide a low distortion, large swing intermediate frequency, the circuit comprising:

a first portion of the circuit which outputs first and second currents each of which include a frequency component equal to a sum of the frequencies of two sets of signals input to the first portion of the circuit and a frequency component equal to a difference of the frequencies of the two sets of signals input to the first portion of the circuit;

a second portion of the circuit which filters one of the two frequency components;

a third portion of the circuit which amplifies a remaining frequency component; and a fourth portion of the circuit which conditions the first and second currents, said current conditioning circuit comprising first and second current mirrors.

4. The circuit of claim 3, wherein the third portion of the circuit comprises a current-to-voltage amplifier.

5. The circuit of claim 4, wherein the current to-voltage amplifier comprises a differential amplifier and a first and a second transistor.

6. The circuit of claim 5, wherein the first and second transistor in the current-to-voltage amplifier each utilize negative feedback.

7. The circuit of claim 6, wherein the first portion of the circuit comprises:

a pair of differential amplifiers connected to a first pair of input terminals wherein the first of the two sets of signals are input; and a differential amplifier connected to a second pair of input terminals wherein the second of the two sets of signals are input.

8. A circuit to provide a low distortion, large swing intermediate frequency, the circuit comprising:

a mixer circuit which outputs a pair of differential currents;

a current-to-voltage amplifier coupled to the mixer circuit to amplify the pair of differential currents;

a filter circuit coupled between the mixer circuit and the current-to-voltage amplifier; and a current conditioning circuit coupled between the filter circuit and the current-to-voltage amplifier, the current conditioning circuit comprising a pair of current mirrors.

9. The circuit of claim 8, wherein the current-to-voltage amplifier comprises a differential amplifier and a pair of transistors each utilizing negative feedback.

10. A method of obtaining a low distortion, large swing intermediate frequency from a circuit on a single semiconductor integrated chip, the method comprising:

obtaining a pair of differential currents having, a first frequency component and a second frequency component;

filtering the second frequency component out of the pair of differential currents leaving a filtered pair of differential currents;

converting the filtered pair of differential currents to a pair of differential voltages; and amplifying the pair of differential voltages.

11. The method of claim 10, further comprising conditioning the filtered pair of differential currents.

12. The method of claim 11, wherein the pair of differential currents is obtained from mixing two sets of signals.

* * * * *